United States Patent [19]

Notani

[11] Patent Number: 5,426,319
[45] Date of Patent: Jun. 20, 1995

[54] HIGH-FREQUENCY SEMICONDUCTOR DEVICE INCLUDING MICROSTRIP TRANSMISSION LINE

[75] Inventor: Yoshihiro Notani, Itami, Japan

[73] Assignee: Mitsubishi Denki Kabushiki Kaisha, Tokyo, Japan

[21] Appl. No.: 54,245

[22] Filed: Apr. 30, 1993

[30] Foreign Application Priority Data

Jul. 7, 1992 [JP] Japan .................................. 4-206106

[51] Int. Cl.⁶ .................... H01L 23/02; H01L 23/12; H01P 1/00
[52] U.S. Cl. .................................. 257/275; 257/668; 257/728; 333/247
[58] Field of Search ............... 257/666, 668, 700, 704, 257/698, 275, 276, 679, 728, 762, 787, 795, 796, 723, 735, 736; 333/247, 248, 246

[56] References Cited

U.S. PATENT DOCUMENTS

| | | | |
|---|---|---|---|
| 4,878,991 | 11/1989 | Eichelberger et al. | 257/700 |
| 5,049,978 | 9/1991 | Bates et al. | 357/74 |
| 5,067,005 | 11/1991 | Michii et al. | 257/700 |
| 5,087,530 | 2/1992 | Wada et al. | 428/596 |

FOREIGN PATENT DOCUMENTS

| | | | |
|---|---|---|---|
| 0337485 | 4/1989 | European Pat. Off. | |
| 62-73758 | 4/1987 | Japan . | |
| 62-229860 | 10/1987 | Japan | 257/704 |
| 63-299370 | 12/1988 | Japan . | |
| 2159013 | 6/1990 | Japan . | |
| 2198159 | 8/1990 | Japan . | |
| 314486 | 1/1991 | Japan . | |
| 3201701 | 9/1991 | Japan | 333/247 |

OTHER PUBLICATIONS

Brandner et al, "Electrical Characterization of Polyhic, A High Density, High Frequency, Interconnection and Packaging Medium for Digital Circuits", IEEE, pp. 759–764.

Geller et al, "Integration And Packaging Of GaAs MMIC Subsystems Using Silicon Motherboards", IEEE GaAs IC Symposium, Technical Digest, Oct. 1990, pp. 85–87.

Primary Examiner—Mark V. Prenty
Assistant Examiner—Carl Whitehead, Jr.
Attorney, Agent, or Firm—Leydig, Voit & Mayer

[57] ABSTRACT

A semiconductor device includes a silicon substrate on which a circuit having a predetermined function is formed and a high frequency circuit chip which is mounted on the silicon substrate and operates at high frequencies, and operates with functions of the silicon substrate and the high frequency circuit chip, wherein a thin film tape having a microstrip structure including an insulating film, a signal line on a surface of the insulating film and a grounding layer on a rear surface of the insulating film, is disposed on the silicon substrate, whereby the silicon substrate is electrically connected to the high frequency circuit chip. As a result, a conventional silicon substrate is employed and a production cost is reduced.

3 Claims, 7 Drawing Sheets

Fig. 9 (a) (Prior Art)
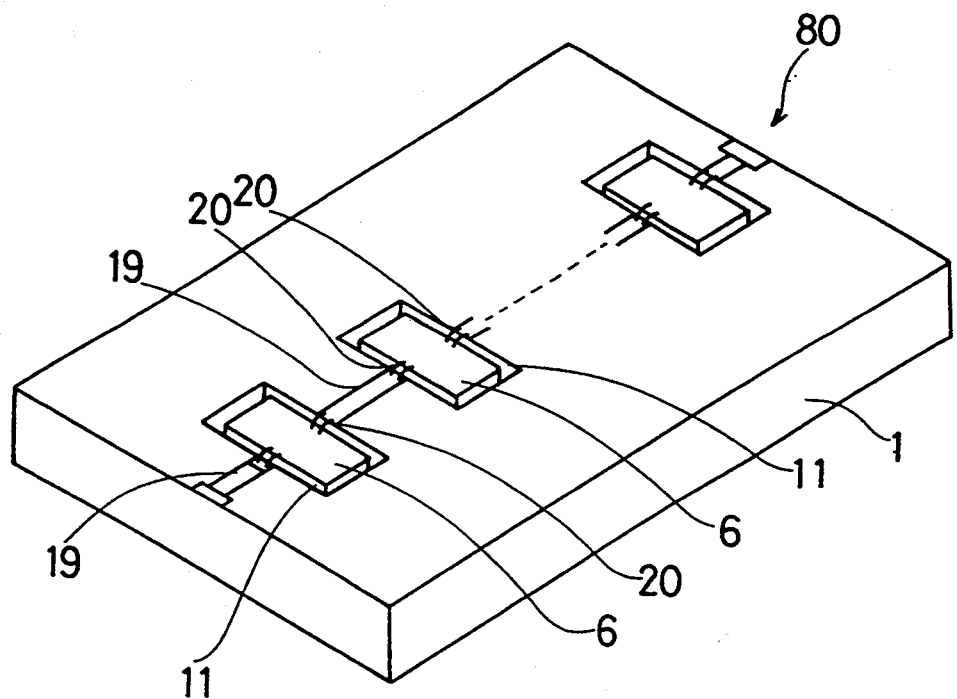
Fig. 9 (b) (Prior Art)
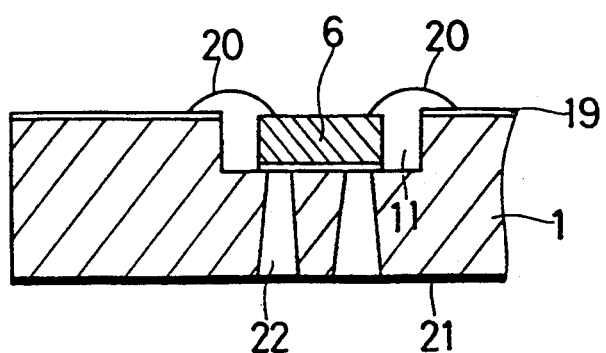

HIGH-FREQUENCY SEMICONDUCTOR DEVICE INCLUDING MICROSTRIP TRANSMISSION LINE

FIELD OF THE INVENTION

The present invention relates to a semiconductor device and, more particularly, to a transmission line for a high frequency signal on a so-called GaAs chip-on Si IC, namely, a silicon substrate on which high frequency GaAs chips are mounted.

BACKGROUND OF THE INVENTIONS

FIGS. 9(a) and 9(b) are diagrams showing a prior art semiconductor device in which high frequency GaAs chips are mounted on a silicon substrate on which an IC pattern is formed. While it is advantageous to constitute a circuit employing a GaAs substrate in view of high speed operation, it is disadvantageous in view of production cost because a GaAs substrate is expensive. Therefore, in general, after a high frequency circuit in which high speed operation is generally required is produced with the GaAs substrate, and other circuits are produced employing a silicon substrate, these combined circuits are fabricated. More particularly, as shown in FIG. 9(a), on the surface of a silicon substrate 1 on which IC patterns such as a memory circuit and wiring are formed, chip die bonding grooves 11 are formed so that a surface of a GaAs chip 6 and a surface of the silicon substrate 1 are at the same level at die bonding of the GaAs chip 6. This GaAs chip 6 is die-bonded in the die bonding groove 11 by solder or the like, and this GaAs chip 6 is connected by a wire 20 to a transmission line 19 formed on the silicon substrate 1. As described above, by packaging the GaAs chip 6 in a concaved part of the substrate 1, the length of the wire 20 connecting the transmission line 19 on the side of the silicon substrate 1 to the GaAs chip 6 is shortened, reducing reflection of high frequency signals.

FIG. 9(b) is a portion of a cross section taken along a line in the longitudinal direction of FIG. 9(a). A grounding line 21 is formed on the rear surface of the substrate 1 in which the die bonding groove 11 is formed, and the grounding line 21 is electrically connected to the rear surface of the GaAs chip 6 through a via hole 22 which is formed in the substrate 1. The characteristic impedance of the transmission line 19 produced on the surface of the silicon substrate 1 is determined by such parameters as the dielectric constant $\epsilon r$ and thickness t of the substrate 1, the width W of the transmission line 19 or the like. Thus, a GaAs chip-on Si IC 80 makes the function of ICs formed on the silicon substrate 1 and the function of the GaAs chip 6 complex.

Further, when sealing a semiconductor device operating at high frequencies such as a GaAs chip or a GaAs chip-on Si substrate, if a dielectric resin material adheres to the pattern of the chip, deterioration in high frequency characteristics occurs, in that the wavelength of a high frequency signal generated in the device varies and deviates from the design value or the dielectric loss increases. In order to prevent this deterioration, the chips are sealed in a hollow package, as illustrated in FIG. 10. In other words, the semiconductor device 80 is encapsulated in a package body 23 which is designed according to the configuration of the semiconductor device 80, an external lead 25 fixed to the package body 23 is connected to an electrode of the semiconductor device 80 with a wire or the like, so as to exchange signals between the semiconductor device 80 and the outside of the package, and the semiconductor device 80 is sealed by fixing a cap material 24 to the package body 23.

In the prior art semiconductor device is constructed as described above, the silicon substrate with high frequency IC chips thereon, is required to have a high insulating property to achieve a resistivity over several K$\Omega$/cm and to reduce loss in transmitting high frequency signals. Therefore, a more expensive silicon substrate having a higher purity than a conventional silicon wafer must be employed, resulting in a high cost. In addition, the hollow package employed for packaging the high frequency IC chip is not widely used, and is specially designed for each chip, resulting in extraordinarily high production cost relative to a case of employing plastic sealing.

SUMMARY OF THE INVENTION

It is an object of the present invention to provide a semiconductor device for mounting a high frequency chip on an IC chip comprising a conventional silicon substrate.

It is another object of the present invention to provide a semiconductor device which is cheap without employing a hollow package, and has a sealing structure in which high frequency characteristics do not deteriorate.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to the those skilled in the art from this detailed description.

In a semiconductor device in accordance with the present invention, a thin film tape having a microstrip structure comprising an insulating film, a signal line on a surface of the insulating film and a grounding layer on a rear surface of the insulating film, adheres to a silicon substrate, and a high frequency circuit chip and a circuit on the side of the silicon substrate are electrically connected by the thin film tape. As a result, the impedance of the signal line is not dependent on the dielectric constant of the substrate.

In addition, an insulating layer having an aperture is disposed between the thin film tape and the silicon substrate and a high frequency circuit chip is encapsulated in the aperture, or a concave part is disposed on the surface of the silicon substrate and a high frequency circuit chip is encapsulated in the concave part, and a portion over the high frequency circuit chip is covered with a cap. As a result, a space is produced over the high frequency circuit chip and plastic sealing is employed.

BRIEF DESCRIPTION OF THE DRAWINGS

FIGS. 9(a) and 9(b) are a perspective view and a portion of a cross section showing a prior art semiconductor device.

DETAILED DESCRIPTION OF THE PREFERRED EMBODIMENT

A first embodiment of the present invention will be described in detail with reference to FIGS. 1(a) to 1(c).

Figure 1:
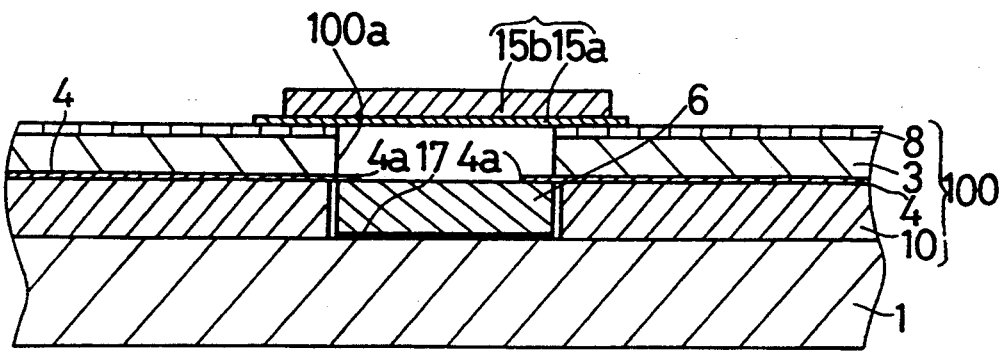
FIGS. 1(a) to 1(c) are cross sectional views showing a semiconductor device in accordance with a first embodiment of the present invention.
Figure 1:
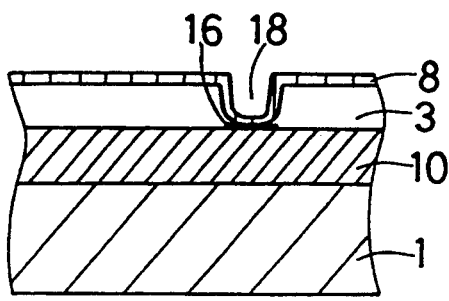
Figure 1:
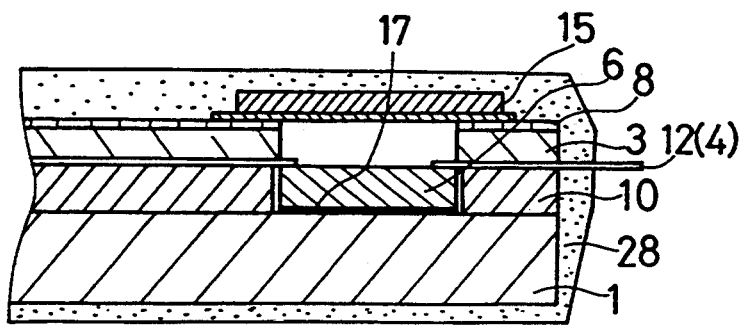
Figure 8:
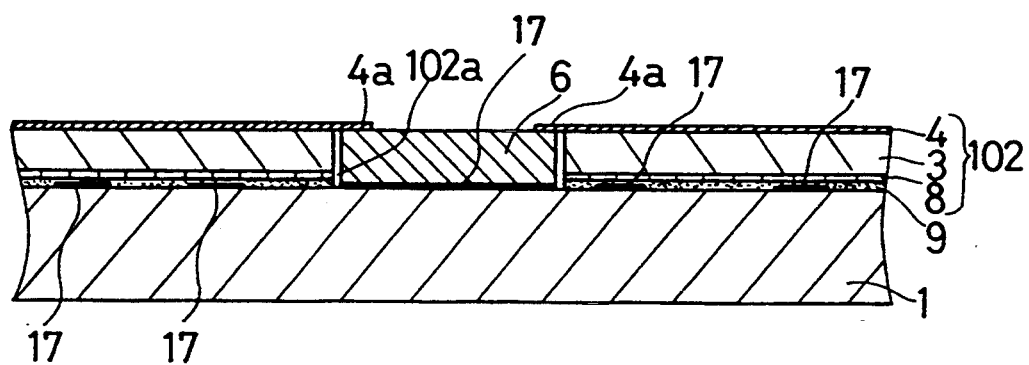
FIG. 8 is a cross sectional view showing a semiconductor device in accordance with a fourth embodiment of the present invention.
Figure 10:
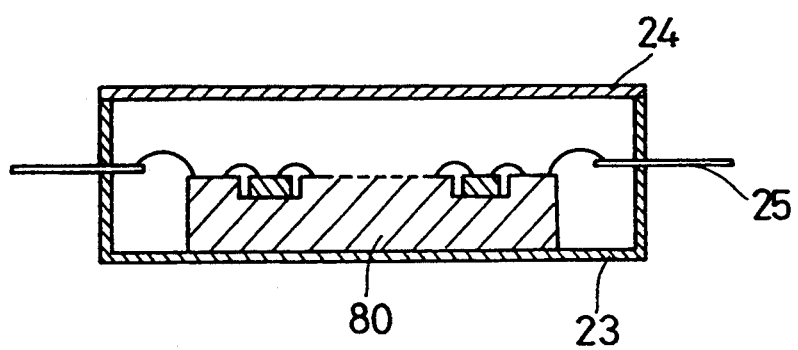
FIG. 10 is a cross sectional view showing the prior art semiconductor device which is encapsulated in a package.

In FIG. 1(a), the same reference numerals as those of FIG. 8 designate the same or corresponding parts. A Tape Automated Bonding (TAB) tape 100 has a structure in which a lower insulating film 10 comprising such material as polyimide, a transmission line 4 to connect with an Si IC pattern, an upper insulating film 3 and a grounding layer 8 are successively laminated from the bottom and a microstrip line comprises the grounding layer 8, the upper insulating film 3 and the transmission line 4. Actually, as described above, the insulating film 3 equipped with the grounding layer and the transmission line is mounted on the lower insulating film 10 by thermocompression bonding or the like employing TAB technique. The lower insulating film 10 has the approximately same thickness as the GaAs chip 6, and high frequency signals are transmitted by connecting an electrode pad on the surface of the GaAs chip 6 to a projection 4a of the transmission line 4. In addition, the GaAs chip 6 is connected to a grounding pad 17 formed on the silicon substrate 1 with solder or the like and is fixed in place. A cap 15 covering an aperture 100a of the TAB tape 100 comprises a metal layer 15a connected to the grounding layer 8 and an insulating material 15b such as polyimide formed on the metal layer 15a to cover the aperture 100a. This keeps a space over the GaAs chip 6 and shields the space electrically. In addition, as shown in FIG. 1(b), the grounding layer 8 is electrically connected to a grounding line 16 which is formed on the same plane as the transmission line 4 via a through hole 18.

Figure 2:
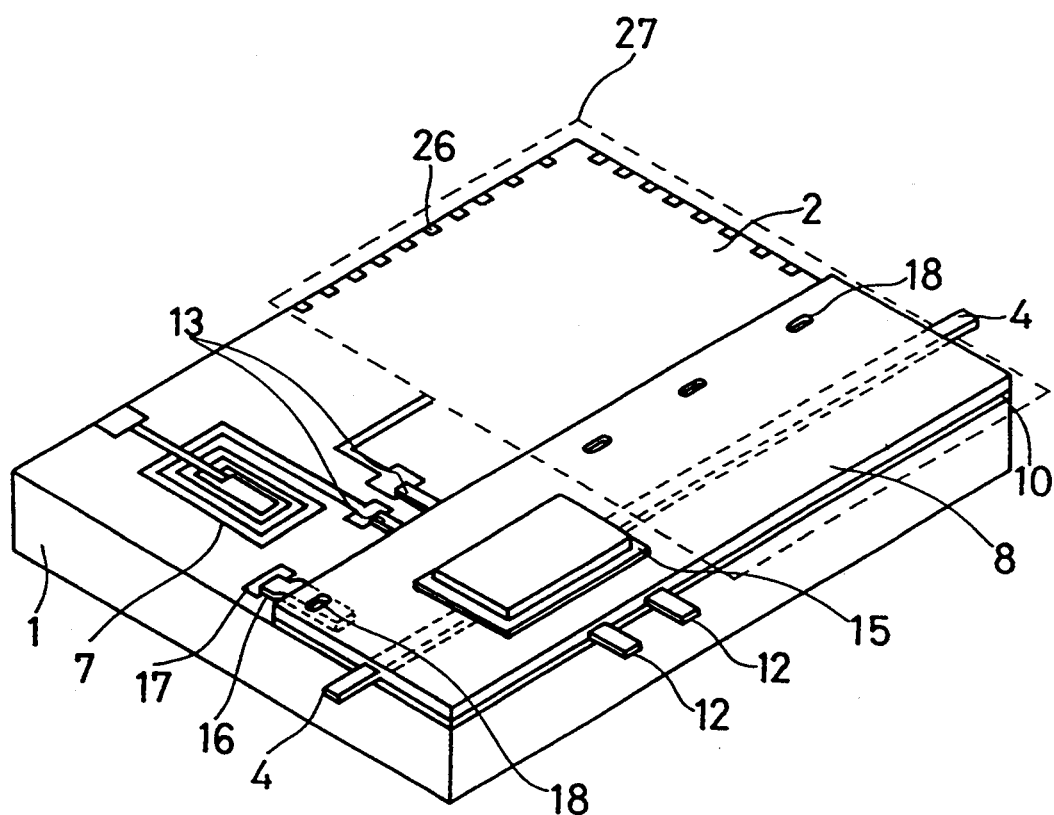
FIG. 2 is a perspective view showing a GaAs chip-on Si IC having the structure of the first embodiment.

FIG. 2 is a perspective view showing a GaAs chip-on Si IC having the structure of FIGS. 1(a) to 1(c). Here, an IC pattern region 27 in which an IC pattern 2 is formed is produced on the silicon substrate 1. A GaAs amplifier comprising an inductor 7 and a GaAs chip is constructed on the silicon substrate 1. As illustrated in the figure, the lower insulating film 10 having an aperture in a region in which the GaAs chip is disposed is arranged on a half surface of the silicon substrate 1. An upper insulating film is provided, which has a transmission line 4, a grounding line 16, DC bias lines 12 and outer lead bondings 13 on a first principal plane, formed on the same surface by etching a thin metal film formed by, for example, copper of 35 microns thickness plated with gold of several microns thickness and a grounding layer 8 on a second principal plane. The grounding layer 8, which is the uppermost layer, is connected to a grounding pad 17 on the surface of the silicon substrate 1 via a through hole 18 and the grounding line 16. In the Si IC pattern region 27, elements of the IC pattern 2 are connected by wiring formed on the rear surface of the lower insulating film 10. The GaAs chip and the Si IC pattern region 27 are connected through the outer lead bonding 13, and the GaAs chip and the inductor 7 are connected through the outer lead bonding 13. Numeral 26 designates an external connecting pad of the IC pattern 2. Although a difference in level equivalent to the thickness of the lower insulating film 10 is produced by connecting the grounding line 16 to the grounding pad 17, it is possible to reduce this difference by forming the grounding pad 17 in a bump configuration or the like.

Figure 3:
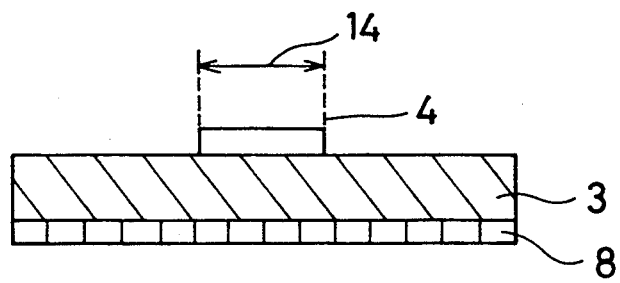
FIG. 3 is a diagram explaining the impedance of a Tape Automated Bonding (TAB) tape of the semiconductor device of FIG. 2.

FIG. 3 is a cross sectional view showing the proximity of a polyimide tape (upper insulating film) 3 of the microstrip line. In order to fix the characteristic impedance of the transmission line 4 at, for example, 50Ω, suppose that dielectric constant of the polyimide tape 3 is 3.5 and the thickness thereof is 50 microns. Then the line width 14 of the transmission line 4 is set up at 95 microns.

FIG. 1(c) is a cross section showing the proximity of the DC bias line 12 or the transmission line 4 when plastic sealing of the GaAs chip-on Si IC of FIG. 1(b). In this structure, even if the chip is sealed by a mold resin 28, deterioration of high frequency characteristics does not occur because the portion over the GaAs chip 6 is a void covered with the cap 15. Then, because the aperture 100a is covered with the insulating material 15b, even employing a thin metal layer 15a for the cap 15, there is no case in which the metal layer 15a would be destroyed by pressure during molding and the mold resin 28 would adhere to the GaAs chip 6.

As described above, in accordance with this embodiment, the TAB tape 100 is disposed on the silicon substrate 1 on which IC patterns are formed, the GaAs chip 6 is in the aperture 100a of the TAB tape 100, the rear surface of the chip 6 is connected to the grounding pad 17, and the transmission line 4 formed on the first principal plane of the upper insulating film 3 is electrically connected to the electrode pad on the surface of the chip 6. Therefore, the characteristic impedance of the transmission line 4 is determined dependent not on the dielectric constant of the silicon substrate 1 but on such parameters as the dielectric constant and thickness of the polyimide tape 3 or the width of the transmission line 4, resulting in a low cost without such constraints as the material of the silicon substrate 1.

In addition, the GaAs chip 6 is encapsulated in the aperture 100a of the TAB tape 100 and the aperture 100a is sealed with the cap 15. Therefore, the space is maintained over the GaAs chip 6 without a specially designed hollow package and packaging is conducted with conventional plastic sealing, reducing production cost.

Secondly, a second embodiment of the present invention will be described in detail with reference to FIGS. 4(a) to 4(c).

Figure 4:
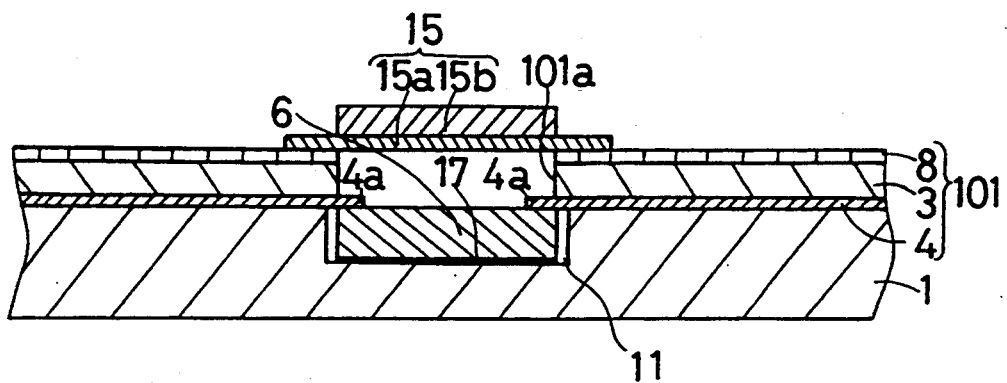
FIGS. 4(a) to 4(c) are cross sectional views showing a semiconductor device in accordance with a second embodiment of the present invention.
Figure 4:
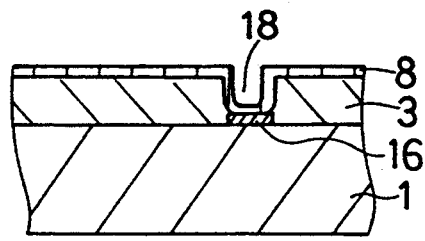
Figure 4:
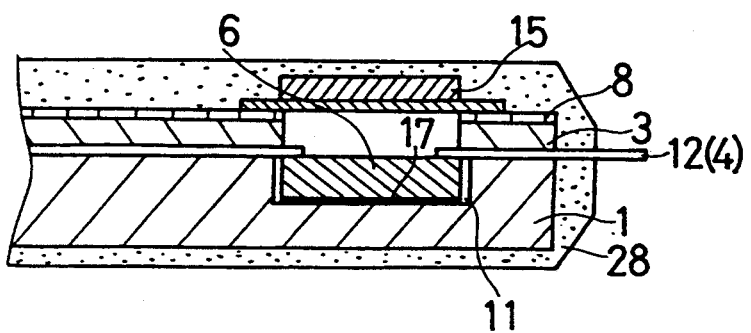

In this embodiment, as illustrated in FIG. 4(a), a chip bonding groove 11 having the same thickness as that of the GaAs chip 6 is formed in the silicon substrate 1, the GaAs chip 6 is in this groove 11 and the grounding pad 17 disposed in the bottom part of the groove 11 is electrically connected to the rear surface of the chip 6. A TAB tape 101 which is constructed by laminating successively the transmission line 4, such an insulating film 3 as polyimide and the grounding layer 8 and has an aperture 101a in a predetermined region, adheres to the silicon substrate 1, so that the transmission line 4 may be in the lower side. The protection part 4a of the transmission line 4 is connected to an electrode pad on the surface of the GaAs chip 6. Further, as illustrated in FIG. 4(b), the grounding layer 8 is electrically connected to the grounding line 16 formed on the same plane as the transmission line 4 via the through hole 18. A cap 15 covers the aperture 101a of the TAB tape 101, having the same construction as that of the first embodiment. This keeps a space over the GaAs chip 6 and shields the space electrically.

Figure 5:
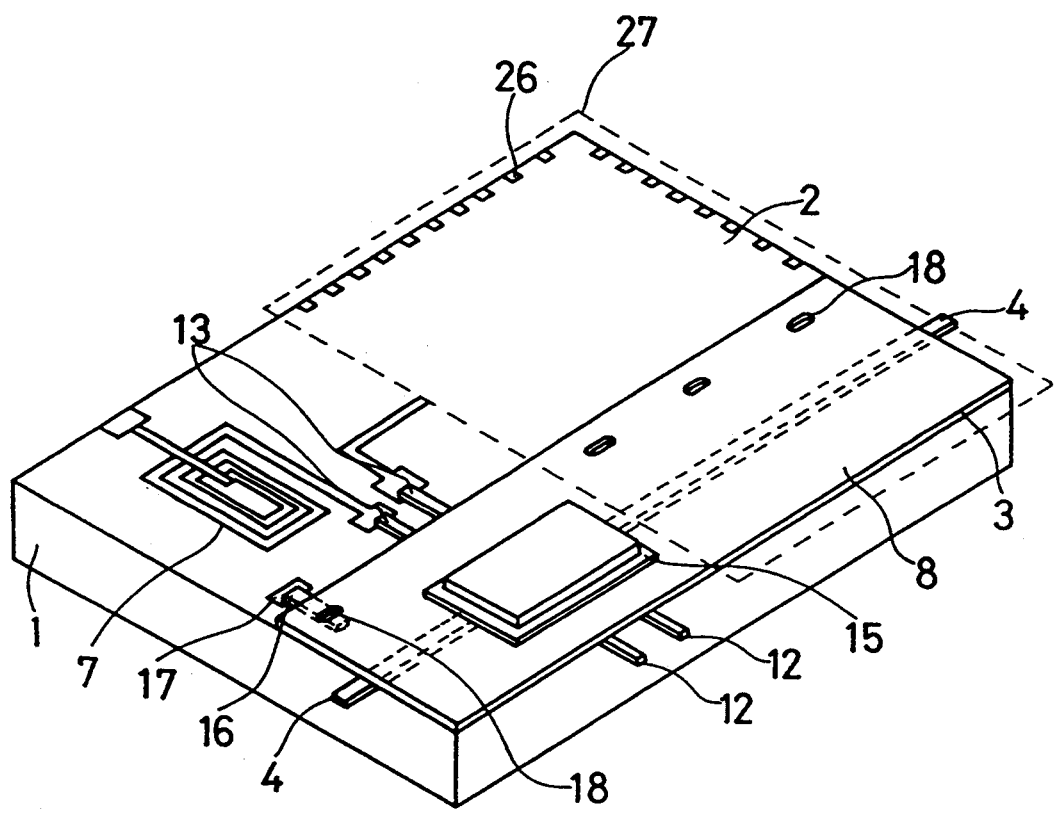
FIG. 5 is a perspective view showing a GaAs chip-on Si IC having the structure of the second embodiment.

FIG. 5 is a perspective view showing a GaAs chip-on Si IC having the structure of FIGS. 4(a) to 4(c). As shown in the figures, the polyimide tape 3 having the aperture 101a in a region including the GaAs chip 6 is arranged on the silicon substrate 1. The transmission line 4, the grounding line 16, the DC bias lines 12 and the outer lead bondings 13 are formed on the same plane by etching a thin metal film of copper plated with gold and are disposed on a first principal plane of the tape 3. In the IC pattern 2, elements are connected by wiring formed in the same plane as the transmission line 4, the grounding line 16 and the DC bias lines 12 and are electrically isolated with from this wiring. The grounding layer 8 is formed on a second principal plane of the polyimide tape 3 and is connected to the grounding pad 17 via the through hole 18 and the grounding line 16.

FIG. 4(c) is a cross section showing the proximity of the DC bias line 12 or the transmission line 4 in performing plastic sealing of the GaAs chip-on Si IC of FIG. 4(b). In this structure, similarly as in the first embodiment, even if the chip is sealed by the mold resin 28, high frequency characteristics do not deteriorate.

As constructed as described above, the same effect as the first embodiment is obtained employing fewer components and the difference in level is reduced in connecting the grounding line 16 and the grounding pad 17.

Thirdly, a third embodiment of the present invention will be described in detail with reference to FIG. 6.

In this embodiment, the TAB tape having a microstrip line structure is fixed so that the grounding layer of the TAB tape may adhere to the silicon substrate. In the figure, numeral 102 designates a TAB tape. The grounding layer 8 is formed on a first principal plane of the polyimide tape 3, and the grounding layer 8 is connected to the grounding pad 17 formed on the surface of the substrate 1. The transmission line 4 is disposed on a second principal plane of the polyimide tape 3 and the projection 4a of the transmission line 4 is connected to an electrode pad on the surface of the GaAs chip 6, which is in an aperture 102a of the TAB tape 102. Still, numeral 5 designates a through hole for which such tools as a bonding blade are inserted in connecting the grounding layer 8 to the grounding pad 17, four example, by ultrasonic welding.

Figure 6:
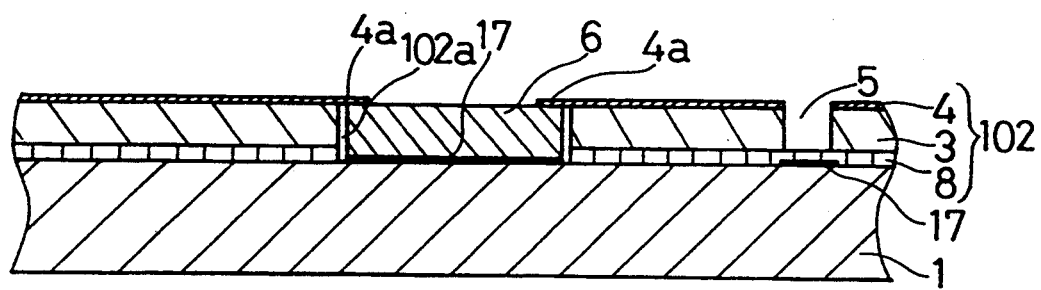
FIG. 6 is a cross sectional view showing a semiconductor device in accordance with a third embodiment of the present invention.
Figure 7:
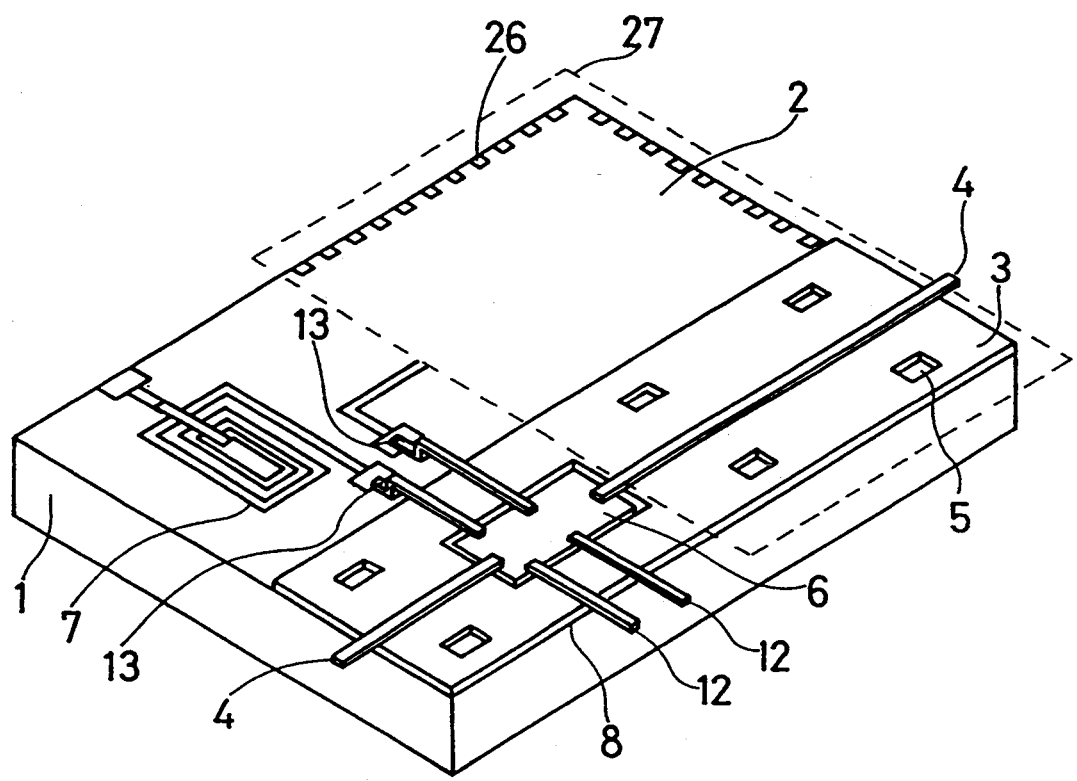
FIG. 7 is a perspective view showing a GaAs chip-on Si IC having the structure of the third embodiment.

FIG. 7 is a perspective view showing a GaAs chip-on Si IC having the structure of FIG. 6. As shown in the figure, the transmission line 4, the DC bias lines 12 and the outer lead bondings 13 are formed in the same plane and are exposed on the polyimide tape 3, and the first principal plane of the polyimide tape 3 adheres to the substrate 1. Elements in the IC pattern 2 are formed in the same plane as the grounding layer 8 and are connected with wiring electrically isolated from the grounding layer 8.

As constructed as described above, the grounding layer 8 is directly connected to the grounding pad 17 without a grounding line, resulting in simplification of the wiring patterns. By connecting the grounding layer 8 and the grounding pad 17 at plural points, adhesion between the substrate 1 and the TAB tape 102 is enhanced. Such a structure is unsuitable for the plastic sealing because the surface of the GaAs chip 6 in the aperture 102a of the TAB tape 102 is exposed. Therefore, considering reliability after packaging, it is desirable to strengthen the adhesion between the TAB tape 102 and the silicon substrate 1 by forming more through holes 5.

Next, a fourth embodiment of the present invention will be described in detail with reference to FIG. 8.

In this embodiment, when the TAB tape having a microstrip line structure is fixed so that the grounding layer of the TAB tape adheres to the silicon substrate, the grounding layer and the grounding pad are connected by disposing a conductive resin between the substrate and the grounding layer. More particularly, as illustrated in FIG. 8, a conductive resin 9 such as epoxy resin mixed with silver powder, is provided between the TAB tape 102 with the grounding layer 8 is directed downward and the silicon substrate 1, thereby connecting the grounding pad 17 on the surface of the substrate 1 to the grounding layer 8 of the TAB tape 102. As a result, there is no necessity to provide through holes for compressing the TAB tape 102 on the substrate 1. This enables the grounding layer 8 to be easily connected to the grounding pad 17. In this case, however, influences due to plastic sealing must be noted, similarly as in the third embodiment. Further, the conductive resin 9 should be carefully disposed in a region where the IC pattern 2 is formed, so that such electric deterioration as short-circuiting between elements may not occur.

While the cap 15 comprises the metal layer 15a and the insulating material 15b in the first and the second embodiments, the insulating material 15b need not be employed if the metal layer 15a has sufficient strength.

As described above, in a semiconductor device in accordance with the present invention, since a TAB tape on which a grounding layer and a signal line are produced on opposite sides of a polyimide tape as a microstrip line is employed for a line transmitting a high frequency signal on a silicon substrate, and the TAB tape is electrically connected by adhering it to the silicon substrate, the impedance of the signal line is not dependent on the dielectric constant of the silicon substrate but on the dielectric constant of the TAB tape and the width of the transmission line. Thus, a conventional silicon substrate is employed, reducing production cost.

In addition, since an insulating layer having an aperture is disposed between the thin film tape and the silicon substrate and a high frequency circuit chip is in the aperture, or a concave part is disposed on the surface of the silicon substrate and a high frequency circuit chip is in the concaved part, and a portion over the high frequency circuit chip is covered with a cap, a space is maintained at the high frequency circuit chip and plastic sealing is performed. As a result, an expensive hollow package is not required, reducing production cost.

What is claimed is:
1. A semiconductor device comprising:
a silicon substrate on which a circuit is disposed;

a high frequency circuit chip mounted on said silicon substrate and operating at high frequencies;

an insulating layer having an aperture and disposed on said silicon substrate, said high-frequency circuit chip being disposed within the aperture in said insulating layer;

a thin film tape having a microstrip structure including an insulating film having opposed front and rear surfaces, an aperture aligned with the aperture in said insulating layer, a signal line on the front surface of said insulating film, the front surface of said insulating film being adhered to said insulating layer, said signal line being connected to said high-frequency circuit chip, and a grounding layer on the rear surface of said insulating film, wherein said silicon substrate is electrically connected to said high frequency circuit chip; and a cap covering the aperture in said insulating film.

2. The semiconductor device according to claim 1 including a grounding line on said thin film tape and a through hole in said thin film tape wherein said grounding layer is connected to said grounding line.

3. The semiconductor device according to claim 1 including a plastic sealing said silicon substrate and said cap.

* * * * *